(12) United States Patent
Abergel et al.

(10) Patent No.: US 10,707,405 B2
(45) Date of Patent: Jul. 7, 2020

(54) ELECTROMECHANICAL ACTUATOR

(71) Applicant: COMMISSARIAT A L'ENERGIE ATOMIQUE ET AUX ENERGIES ALTERNATIVES, Paris (FR)

(72) Inventors: Julie Abergel, Grenoble (FR); Jean-Sebastien Danel, Echirolles (FR); Emmanuel Defay, Grenoble (FR); Gwenael Le Rhun, Renage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 601 days.

(21) Appl. No.: 15/625,593

(22) Filed: Jun. 16, 2017

(65) Prior Publication Data
US 2017/0365770 A1    Dec. 21, 2017

(30) Foreign Application Priority Data

Jun. 17, 2016    (FR) ........................ 16 55649

(51) Int. Cl.
*H01L 41/09* (2006.01)
*H01L 41/08* (2006.01)
(Continued)

(52) U.S. Cl.
CPC ........ *H01L 41/094* (2013.01); *H01L 41/0825* (2013.01); *H01L 41/0973* (2013.01);
(Continued)

(58) Field of Classification Search
CPC ............... H01L 41/094; H01L 41/0825; H01L 41/0973; H01L 41/29; G01L 1/142; G01L 1/16
(Continued)

(56) References Cited

U.S. PATENT DOCUMENTS 4,638,205 A    1/1987 Fujita et al.
2003/0164048 A1    9/2003 Shkel
(Continued)

FOREIGN PATENT DOCUMENTS

BE    1003565 A6    4/1992

OTHER PUBLICATIONS

French Preliminary Search Report dated Mar. 15, 2017 in French Application 16 55649 filed on Jun. 17, 2016 (with English Translation of Categories of cited documents and Written Opinion).
(Continued)

*Primary Examiner* — Thomas M Dougherty
(74) *Attorney, Agent, or Firm* — Oblon, McClelland, Maier & Neustadt, L.L.P.

(57) ABSTRACT

This invention relates to an electromechanical actuator comprising a support and a deformable element comprising a portion anchored to at least one anchoring zone of the support and mobile portion, the deformable element comprising an electro-active layer, a reference electrode arranged on a first face of the electro-active layer an actuating electrode arranged on a second face, opposite the first face, of the electro-active layer comprises a capacitive device for measuring the deformation of the deformable element, said device being at least partially formed by a capacitive stack comprising a measuring electrode on the second face of the electro-active layer, a measuring portion of the reference electrode located facing the measuring electrode, and a portion of the electro-active layer inserted between the measuring electrode.

17 Claims, 10 Drawing Sheets

A-A

(51) Int. Cl.
    *G01L 1/14*           (2006.01)
    *G01L 1/16*           (2006.01)
    *H01L 41/29*         (2013.01)

(52) U.S. Cl.
    CPC ............... *G01L 1/142* (2013.01); *G01L 1/16* (2013.01); *H01L 41/29* (2013.01)

(58) Field of Classification Search
    USPC .......................................... 310/311–371, 800
    See application file for complete search history.

(56) References Cited

U.S. PATENT DOCUMENTS

2006/0196267 A1*  9/2006  Takahashi .......... G01C 19/5663
                                                           73/504.12
2011/0080069 A1    4/2011  Cueff et al.

OTHER PUBLICATIONS

Takeshi Kobayashi, et al. "Development of Self-Sensitive Piezoelectric Cantilever Utilizing PZT Thin Film Deposited on SOI Wafer", Integrated Ferroelectrics, vol. 89, 2007, 8 pages.
Noboru Wakatsuki, et al. "Piezoelectric Actuator of $LiNbO_3$ with an Integrated Displacement Sensor", Japanese Journal of Applied Physics, vol. 37, No. 5B, 1998, 5 pages.
T.M. Shaw, et al. "The effect of stress on the dielectric properties of barium strontium titanate thin films", Applied Physics Letters, vol. 75, No. 2129, 1999, 5 pages (Abstract Only).

* cited by examiner

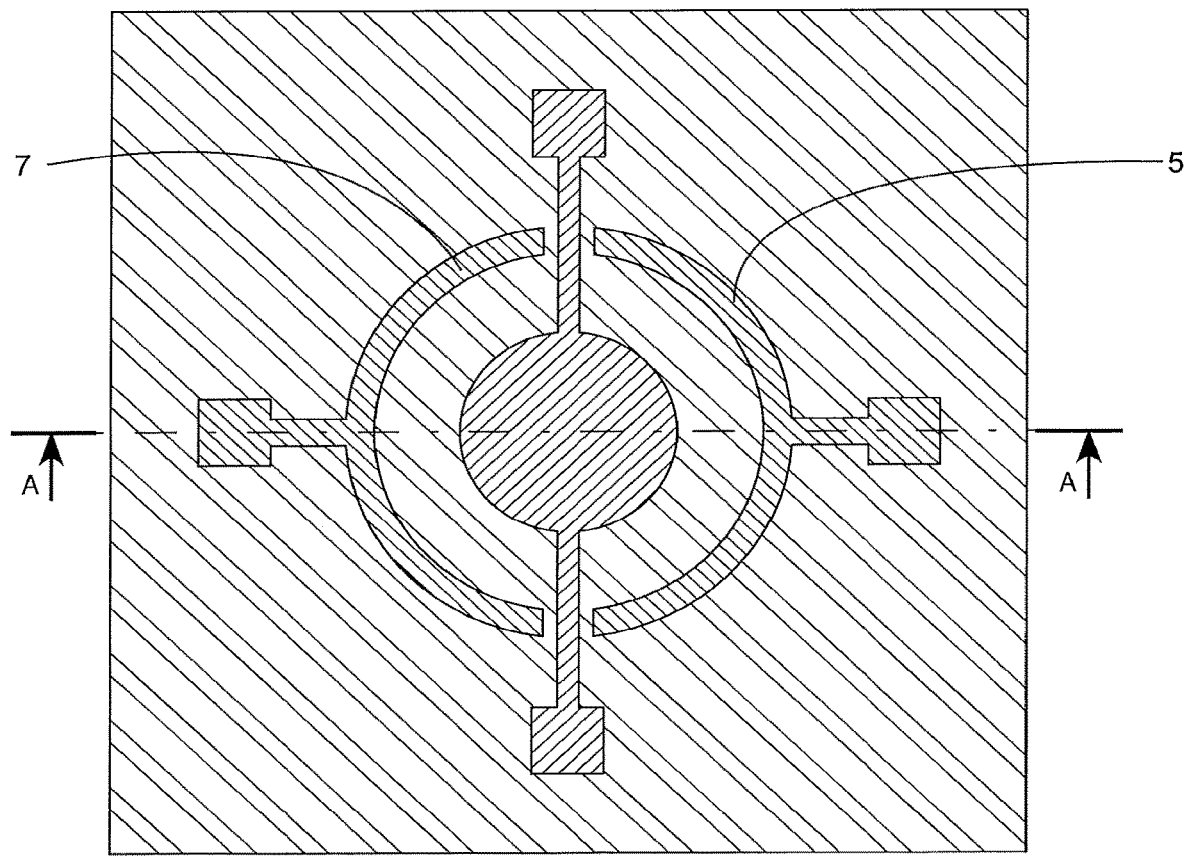
FIG. 12a
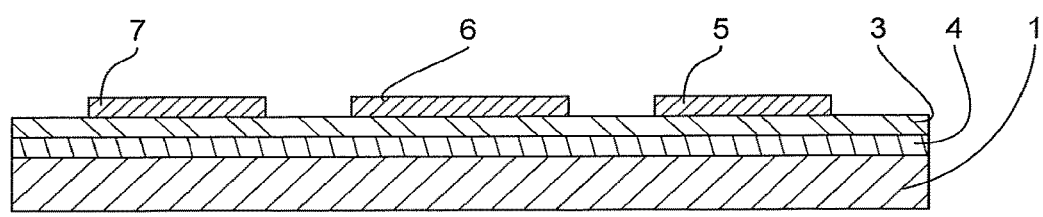
FIG. 12b  A-A

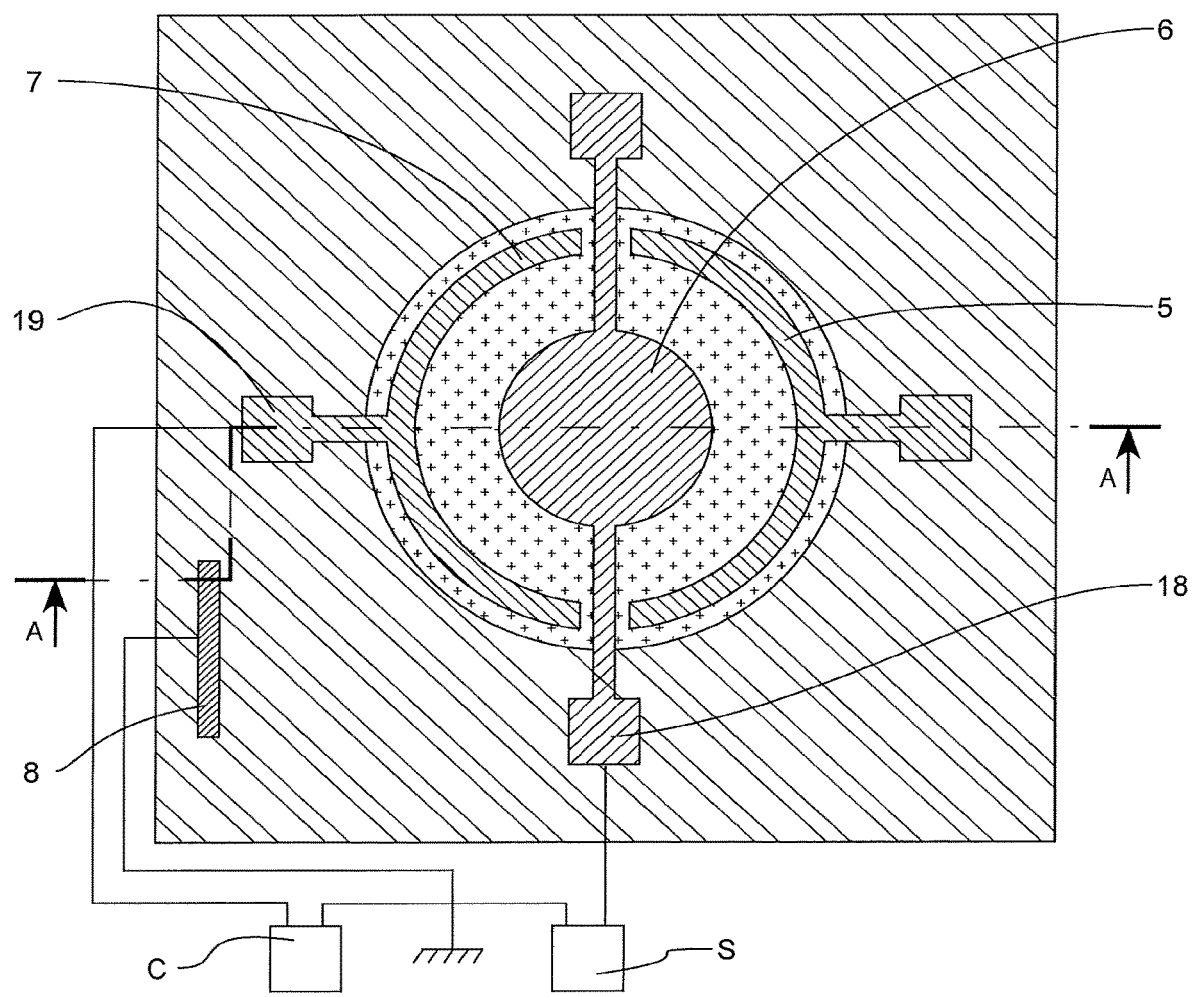
FIG. 16a
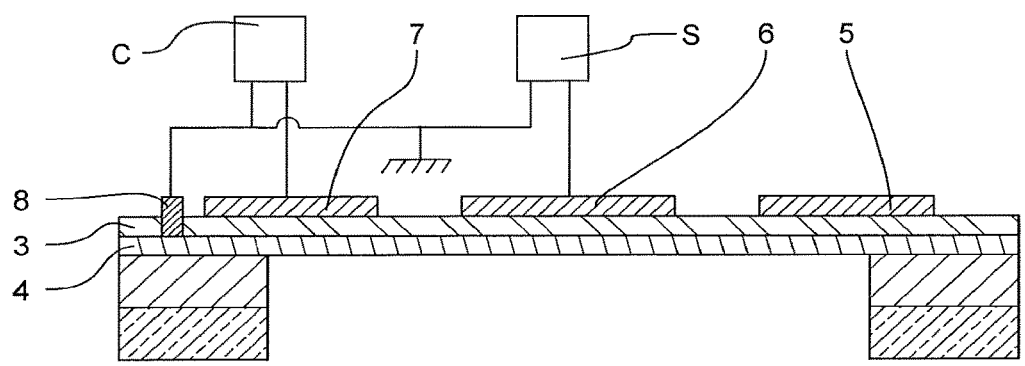
FIG. 16b      A-A

ELECTROMECHANICAL ACTUATOR

FIELD OF THE INVENTION

This invention in general relates to the production of microelectronic components. This can entail electromechanical actuators, more particularly in the form of MEMS and/or NEMS (micro or nano electro mechanical systems"). Indicative applications are micro-pumps and micro-switches. The invention will be particularly suitable for analog actuators or actuators subjected to external disruptions (including variations in temperature, pressure, aging of parts).

TECHNICAL BACKGROUND

Microelectronics is undergoing a strong diversification in components often intended to be used in more complex devices. Some of these components involve a deformation of a mobile portion under the control of an electric signal in order to form an actuator. In certain cases, a deformation sensor is present therein in order to evaluate the level of deformation obtained by the electric control, advantageously in real time. This evaluation can allow for a retrocontrol of the control of the actuator, for example in order to finely reach a desired level of deformation.

There are techniques, described in publication EP2309559 A1, in order to incorporate a gage for measuring the deformation in an actuator. The structure that is presented therein, in particular in FIG. 1, combines a piezoelectric actuator with a piezoresistive gage connected to a device for measuring resistance. Under the effect of a voltage applied to the terminals of the piezoelectric layer, the structure bends as such deforming the piezoresistive gage. The resistance of the gage is then modified, which makes it possible to evaluate the deformation of the structure. This device however has several disadvantages:

- the piezoresistive detection results in a dissipation of energy by the Joule effect, inducing on the one hand an overconsumption of energy and on the other had a heating of the device that can modify the piezoelectric properties of the layer and even degrade the structure.
- In case of an external disturbance (for example a variation in temperature), the sensor and the actuator are not affected in the same way, which will induce a measurement error.
- In addition, the sensitivity of the sensor decreases when the width of the gage increases, which imposes producing thin gages and therefore more difficult to produce (in thin layers, these limitations can be due to the lithography resolution).

Publication KOBAYASHI et al entitled "Development of Self-sensitive Piezoelectric Cantilever Utilizing PZT Thin Film Deposited on SOI Wafer" from INTEGRATED FERROELECTRICS, Vol. 89, 2007, pages 116-122, discloses an actuator that comprises a stack with two electrodes and an inserted piezoelectric layer. It also comprises a deformation sensor with a sensor electrode that measures a signal of the voltage at this level, in relation with the frequency of the input signal of the actuator. This voltage signal frequency information is then used. Even if the measuring electrode is individualized and separated from the one used for actuating, this here is a measurement of the voltage coming from a vibration and piezoelectric behavior of a stack of layers.

An equivalent technique is presented in publication WATATSUKI N et al entitled "Piezoelectric Actuator of LiNbO3 with an Integrated Displacement Sensor" from JAPANESE JOURNAL OF APPLIED PHYSICS, Vol. 37, no. 5B, 1998, page 2970-2973.

Disadvantages in frequency detection with current techniques are:

- that the measurements are difficult (as the instrumentation is complex), not very accurate; there are issues with absorption linked to the atmosphere that can introduce measurement uncertainty. Moreover an actuator does not need in general to be actuated at its resonance frequency for its mobility as such, but this is what is imposed by the frequency detection method and which can in particular accelerate the aging of the component.
- that the most effective actuator materials such as PZT are often poor resonators and reciprocally (a good resonator and not as good actuator), which requires choices that penalize either mobility, or the measurement.

It is therefore an object of the invention to overcome at least partially the disadvantages of the current techniques by offering an actuator in which a deformation measurement can be taken in an improved manner.

SUMMARY OF THE INVENTION

An aspect of this invention relates to an electromechanical actuator that comprises a support an a deformable element that comprises a portion anchored to at least one anchoring zone of the support and a mobile portion, with the deformable element comprising an electro-active layer, a reference electrode arranged on a first face of the electro-active layer and an actuating layer arranged on a second face, opposite the first face of the electro-active layer, with the electro-active layer being configured to be deformed under the effect of a difference in potential applied between the reference electrode and the actuating electrode, Advantageously, it comprises a capacitive device for measuring the deformation of the deformable element, said device being at least partially formed by a capacitive stack comprising a measuring electrode arranged on the second face of the electro-active layer, a measuring portion of the reference electrode located facing the measuring electrode, and a portion of the electro-active layer inserted between the measuring electrode and the measuring portion of the reference electrode.

As such, an advantage is taken from an actuating by an electro-active layer—which can for example be piezoelectric—while still having a deformation evaluation of the capacitive type, the nature of the value measured by the capacitive device being a capacity of the capacitive stack. This capacity value can be used to determine the deformation. The invention then combined techniques that are a priori substantially heterogeneous but this combination allows for great effectiveness in actuation and in detection. Furthermore, the capacitive detection is wisely incorporated into the actuator in order to simplify manufacturing. In particular, the electro-active layer of the actuator participates in the capacitive stack.

While the current measuring techniques are of a nature similar to that of actuating, by using the electrical effects of piezoelectric layers, in particular by measuring variations in the voltage signal frequencies coming from piezoelectric layers, this invention has the advantage of carrying out a capacity measurement and to allow for the monitoring of the variation thereof. This goes against a constant bias as to the use of the mechanical behavior of a piezoelectric element. It is, advantageously, the capacity value of a stack that is measured directly between the measuring electrode and the measuring portion of the reference electrode.

The capacitive measurement of the invention is potentially less complex to implement and is of good precision, without this precision varying according to the electro-active materials in proportions such as known for the current frequency techniques. Although even if the capacitive measurement could have appeared as against nature in the context of an actuator with an electro-active layer in the stack of which the capacity is measured, this solution is, in the end, advantageous.

This invention also relates, in embodiments, to a method for producing an actuator.

Another aspect of embodiments of the invention relates to an electronic system, such as a micro-pump or a micro-switch, comprising at least one actuator as described hereinabove.

BRIEF INTRODUCTION OF THE DRAWINGS

Other characteristics, aims and advantages of this invention will be illustrated in the following detailed description and with regards to the appended drawings which are given as non-exhaustive examples and wherein:

FIGS. 11a, 11b, 12a, 12b, 13a, 13b, 14a, 14b, 15a and 15b shows the steps of a method of producing an actuator.

Figure 1:
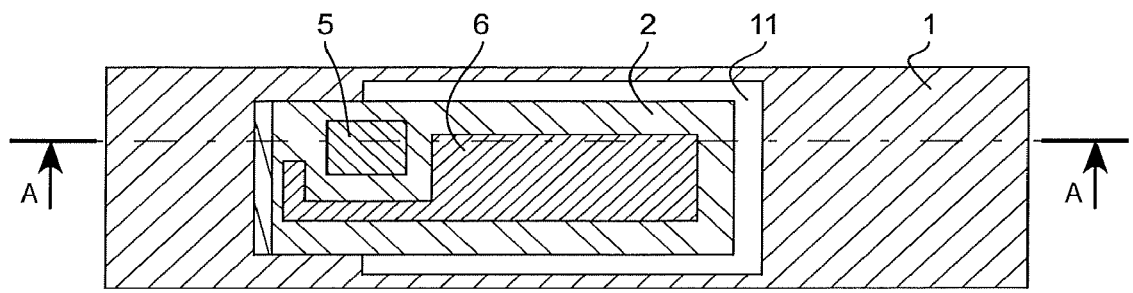
FIG. 1 illustrates a top view of a first embodiment of the invention.

FIGS. 16a and 16b respectively present from the top and as a cross-section the connection of the electronic components at different parts of the actuator.

The drawings are given as examples and are not limiting to the invention. They are schematic representations of a principle intended to facilitate the understanding of the invention and are not necessarily on the scale of the practical applications. In particular, the relative thicknesses of the various layers, and substrates may not be representative of reality.

DETAILED DESCRIPTION

Before undertaking a detailed review of embodiments of the invention, optional features are listed below that can optionally be used in any combination or alternatively:

the capacitive stack is located in the vicinity of the anchoring zone 12;
the capacitive stack is located for a portion in the anchored portion and for a portion in the flexible portion;
at least one portion of the capacitive stack is located in a zone of the deformable element 2 that has a peak of concentration of stresses in flexure;
the mobile portion comprises a beam or a membrane with a circular, rectangular or polygonal profile;
at least one portion of the measuring electrode has a profile parallel to the profile of the mobile portion;
at least one portion of the measuring electrode has an arched profile and at least one portion of the mobile portion has a circular profile, said profiles being preferably parallel.
the measuring device comprises a secondary capacitive stack that comprises a secondary measuring electrode 7 arranged on the second face of the electro-active layer 3, a secondary measuring portion of the reference electrode 4 located facing the secondary measuring electrode 7, and a portion of the electro-active layer 3 inserted between the secondary measuring electrode 7 and said secondary measuring portion of the reference electrode 4;
at least one portion of the secondary measuring electrode 7 has a profile parallel to the profile of the mobile portion;
the profile of the portion of the secondary measuring electrode 7 is located at mid-radius from the circular profile of the membrane;
one portion of the secondary capacitive stack is located in a zone of the deformable element 2 that has a minimum of concentration of stresses;
at least one portion of the secondary capacitive stack is located in a zone of the deformable element 2 having a stress with a sign opposite that of the zone in which is located at least one portion of the capacitive stack;
a device for the differential treatment of the variations in the value of the capacity of the capacitive stack and of the secondary capacitive stack;
a voltage source S connected, by a first of its terminals, to the actuating electrode 6, a capacity meter C connected, by a first of its terminals, to the measuring electrode 5, the second terminals of the voltage source and of the capacity meter being both connected to the reference electrode 4 and to the reference potential;
the electro-active layer 3 comprises at least one layer of a material chosen from: a piezoelectric material, an electro-strictive material, a pare-electric material or a relaxor material;
the measuring electrode 5 and the actuating electrode 6 are etched portions of the same layer of material.

It is specified that in the context of the present invention, the term "on" or "above" do not necessarily mean "in contact with." Thus, for example, the deposition of a layer on another layer does not necessarily mean that the two layers are directly in contact with each other, but this means that one of the layers at least partly covers the other while either being directly in contact with it or being separated from it by a film, another layer or another element. A layer can moreover be comprised of several sub-layers of the same material or of different materials.

Expressions of the type "facing" means the arrangement of a first element in relation to a second, in which the two elements are opposite about an intermediate portion, such as an electro-active layer. Preferably, the projection of an element according to a direction in thickness of the layers intersects the other element.

It is specified that, in the framework of this invention, the thickness of a layer is measured along a direction perpendicular to the surface according to which this layer has its maximum extension.

The use of the singular for certain elements of the invention does not necessarily mean that a given element is present singularly in the invention. The word "a" or "an" does not exclusively mean "a single" unless it is arranged otherwise. In particular, it will be seen that several measuring electrodes can be present in the invention.

According to the invention, the term microelectronic device means a device that comprises elements of micrometric and/or nanometric dimensions. The same applies for the term "electronic component" which may be used here. Any system that has for its operation at least one electric element falls within the scope of the invention. This microelectronic device can be a MEMS that for example has a mechanical and/or optical and/or photonic and/or electrical function.

The drawings, and the following description, focus for simplicity on the formation of a single actuating component but it is understood that several actuators can be manufactured simultaneously or successively on the same support or substrate, for example by grasping and placing a plurality of second substrates, vis a technique such as flip chip (adding by docking of chips).

FIG. 1 shows a top view of a first embodiment of the invention with a support 1 used as a base for the receiving of an actuating system. The support 1 can be made of different materials and for example made of a semiconductor material with a silicon base. The support 1 receives a deformable element 2 here with a substantially flattened extended shape, in the shape of a blade or beam. The deformable element 2 comprises a portion integral with one of the faces 13 of the support 1, on an anchoring zone 12 of said support 1. The anchored portion is intended to not undergo any deformation resulting in a movement according to the direction of deformation of the deformable element 2. In the case shown in the various figures but which is not exhaustive, the deformable element 2 has a bending capacity relatively to the support 1 outside of the anchored portion.

In the case of FIGS. 1 to 6, the anchoring zone 12 of the support 1 is a single portion of a face 13 of the support. This solution is not exhaustive. In particular, as shall be seen in reference to FIGS. 7 to 10 in particular, the anchoring zone can be distributed into several zones of the face 13 of the support. This can even be a continuous surface such as a closed contour such as the one shown in FIGS. 7 to 10.

Contrary to the anchored portion of the deformable element 2, another portion is intended to undergo a movement by deformation, preferably entirely elastic, of a portion of the deformable element 1. This portion corresponds to a mobile portion that is not retained in a movement for example with respect to the support 1. This movement coming from a deformation can be in flexure according to one or several axes and/or in traction and/or in compression and/or in torsion according to one or several axes. This movement can therefore be of a nature that is different and/or be complex. In the example that follows, the mobile portion which is subject to this movement is mobile in flexure, referred to as the flexible portion, according to one direction, but this is only indicative. Generally, the support 1 is configured to immobilize the anchoring zone without immobilizing the mobile portion, according to the movement desired.

In particular, in the various figures, the support 1 comprises a cavity 11 facing the flexible portion of the deformable element 2 within which the mobile, here flexible, can move. In addition, in the case of FIGS. 1 and 2, the flexible portion is an elevation relatively to the support 1 in such a way that a relative freedom of movement is permitted according to the direction of the height of the support. In the case of these two figures, the actuator comprises a beam 14 for example made of SiN of which a portion is in contact with the face 13 of the support 1 in such a way as to form the anchored portion and of which a portion is in elevation relatively to the support 1 in such a way as to preserve a space between the face 13 and the lower surface of this portion, in such a way as to authorize a deformation in flexure at this level.

In the case of the other embodiments shown, the support 1 comprises a cavity 11 that is sufficient for authorizing the movement of the deformable element 2. In the cases shown, the cavity 11 opens up on the two faces opposite the support 1. However, this arrangement is not limiting and a cavity in the shape of a blind hole of which the mouth is solely on the face 13 of the support 1 can suffice.

Preferably, the deformation in flexure takes place according to a direction of rotation parallel to a plane of the face 13 of the support 1. Generally, it is desirable that the flexible portion, and preferably the entire deformable element 2, extend parallel to the support 1.

Figure 2:
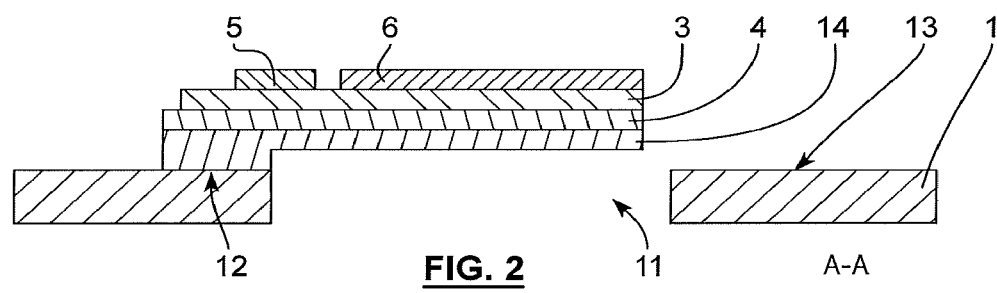
FIG. 2 shows the actuator of FIG. 1 as a cross-section according to the lines AA of FIG. 1.

FIG. 2 is a cross-section view according to the lines A-A of FIG. 1. This figure makes it possible to apprehend on the one hand the realization in elevation of the deformable element and on the other hand the chaining of the various layers used to form the deformable element 2. Note successively the presence, starting from the support 1, of the beam 14, of a reference electrode 4, of an electro-active layer 3 and of an upper portion comprising one or several measuring electrodes 5 and one or several actuating electrodes 6.

Electro-active layer means a layer that is made of at least one sub-layer of a material of which the dielectric constant varies with the mechanical stress. As such, use will be made if possible of materials that have substantial variations in permittivity. It is possible for example to use para-electric materials of which the variation in permittivity can reach in particular $2.7 \cdot 10^{-2}$%/MPa. According to another possibility, the electro-active layer is made at least partially of a piezoelectric material, such as lead and titanium zirconate, of aluminum nitride or zinc oxide, LiNbO3. Other electro-active materials can also be mentioned: KNaNbO3, LiTaO3, PMN-PT (Pb(Mg,Nb)O3-PbTiO3), polymers (PVDF), doped PZT (La, Nb, Mn, . . . ) and doped AlN (Sc). Relaxor materials can also be used. It is possible moreover to choose materials that have a high electro-strictive coefficient which makes it possible to obtain high sensitivity.

Preferably but not exclusively, the thickness of the electro-active layer is between 0.1 μm and 0.2 μm.

The reference electrode 4 is arranged in contact with a first face, also called lower face, of the electro-active layer 3. It is furthermore above the face 13 of the support 1. The thickness of this layer is advantageously less than or equal to that of the electro-active layer 3. Moreover, the function of the electrode 4 is to serve as an electrical conductor on one of the faces of the electro-active layer 3. As such, it is possible to use materials that are usually used to form electrodes in microelectronics. This can for example be platinum or tungsten or aluminum, copper, silver, nickel, chromium, or alloys of these types of metals. Advantageously, the reference electrode 4 covers the totality of the lower face of the electro-active layer 3.

On a face opposite the electro-active layer 3, other electrodes are formed. This portion comprises at least one actuating electrode 6 that makes it possible, in conjunction with the reference electrode 4, with these two electrodes facing, to apply a difference in electrical potential between the two faces of the electro-active layer in such a way as to control it in deformation. The same materials can be used as those indicated for the layer of the reference electrode 4 with regards to the actuating electrode 6.

In the case of the embodiment of FIGS. 1 and 2, the actuating electrode 6 extends from the anchored portion to the flexible portion, preferably with a longitudinal direction corresponding to that of the flexible portion. On the other hand, the electrode 6 can be arranged on the longitudinal axis of the flexible portion.

On this same face of the electro-active layer 3 in contact with the electrode 6, at least one measuring electrode 5 is also present. As such, the actuating electrode 6 does not advantageously cover the entire surface of the electro-active layer 3 facing the reference electrode 4. In this way, a residual surface is arranged for the receiving of at least one measuring electrode 5. The latter extends at least partially over a zone of the surface of the electro-active layer 3 on which a deformation is produced, namely in the flexible portion. This does not prevent the measuring electrode 5 from also being able to partially cover the anchored portion of the deformable element 2. This is the case shown in FIGS. 1 and 2 on which a measuring electrode 5 extends from the anchored portion to the flexible portion overhanging the cavity 11, on a beam portion of the deformable element 2 in elevation relatively to the support by a form of hanger bar.

The materials and dimension in thickness that are possible for the measuring electrode 5 can be chosen in accordance with the provided examples for the actuating electrode 6. They are moreover preferably coming from the same layer of material. The measuring electrode 5 extends however advantageously over a lesser surface of the face of the electro-active layer 3 in such a way as to locate a deformation measurement 2 of the deformable element. Thereupon, the measuring electrode 5, the portion of the underlying electro-active layer 3 and the portion, referred to as measuring portion, of the reference electrode 4 located faced the measuring electrode 5 form a capacitive stack that allows for a capacitive detection of a level of deformation. In the example of FIGS. 1 and 2, the measuring electrode 5 is of a rectangular contour.

Advantageously, it is interesting to place this capacitive stack in such a way as to cover a zone with a substantial mechanical stress during the flexure of the flexible portion. As such, favor will be given to a location of this stack at a stress concentration zone. Typically, for an actuator such as in the embodiments shown in FIGS. 1 to 6, wherein the deformable element is primarily in the form of a blade, it will be advantageous that at least a portion of the capacitive stack be located in the vicinity of the anchoring zone 12 relatively to the support 1. This is the sense of the examples of FIGS. 1 to 6 wherein the electrode 5 is located in such a way that the capacitive stack is located straddling the anchoring zone 12 and a zone of the flexible portion of the deformable element 2 in the vicinity of the anchoring zone 12.

Figure 3:
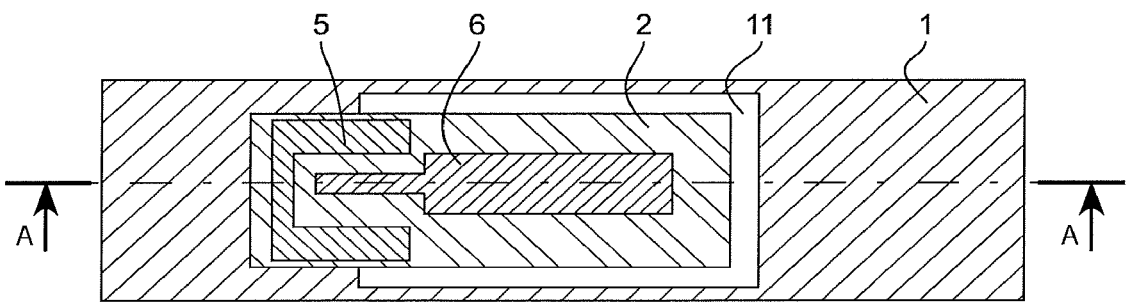
FIG. 3 is a top view of a second embodiment of the invention.

FIG. 3 is a top view of an alternative of the FIGS. 1 and 2 wherein the deformable element 2 is directly in contact with the support 1 in the anchored portion, without having recourse to an additional beam element. Here, the flexible portion of the deformable element is located overhanging a cavity 11 forming a volume that authorizes the freedom of movement of this flexible portion. Moreover, this embodiment shows a different aspect of the form of measuring electrode 5. The latter has a U-shaped contour with a base branch, here located on the anchoring zone 12, perpendicular to the longitudinal direction of the deformable element 2, and two lateral branches perpendicular to the base branch and extending over the flexible portion. Moreover, in this example, the two lateral branches of the measuring electrode 5 are located on either side of a portion of the actuating electrode 6. Advantageously, the U-shaped profile of the electrode 5 is symmetrical according to the longitudinal direction of the deformable element 2.

Figure 4:
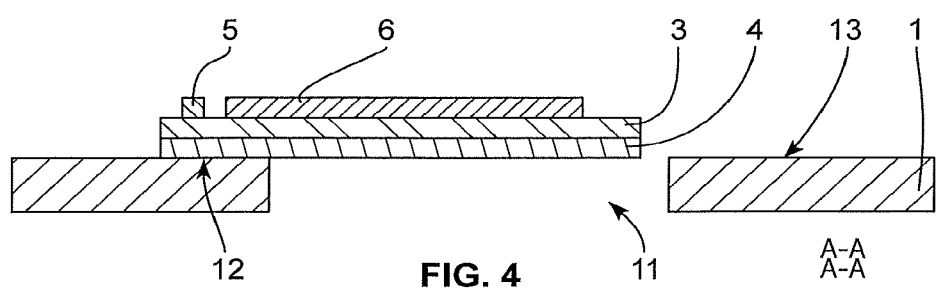
FIG. 4 is a view of the actuator of FIG. 3 as a cross-section according to the lines AA of FIG. 3.
Figure 5:
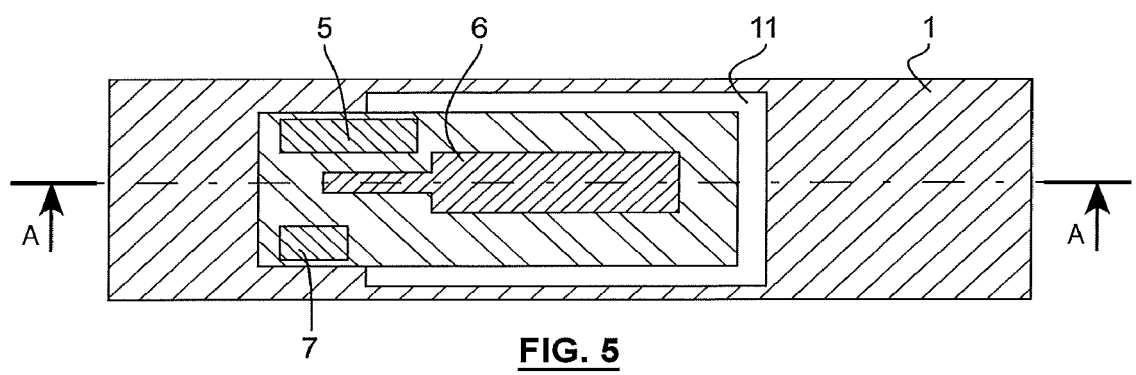
FIG. 5 is a top view according to a third embodiment of the invention.
Figure 6:
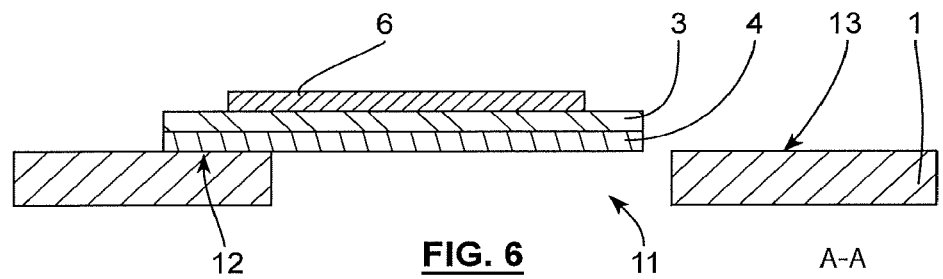
FIG. 6 is a view of the actuator of FIG. 5 as a cross-section according to the lines AA of FIG. 5.

FIG. 5 is a top view of a third embodiment wherein the electrode 6 is to similar to the one shown in the example of FIGS. 3 and 4, and with a measuring electrode 5 of rectangular shape straddling over the anchoring zone 12 and the zone of the deformable element overhanging above the cavity 11. Furthermore, this embodiment has a secondary measuring electrode 7. Similarly to the capacitive stack formed from the measuring electrode 5, of an underlying portion of the active electrode 3 and from a portion facing the reference electrode 4, the secondary electrode 7 allows for the formation of a capacitive stack with an underlying portion of the electro-active layer 3 and a portion, called the secondary measuring portion, of the reference electrode 4 located facing the secondary measuring electrode 7. In the case shown in FIGS. 5 and 6, the electrode 7 is placed in such a way as to form a secondary capacitive stack located on the anchoring zone 12 of the support 1. In this way, the stresses that are applied are low, even zero. This solution can be implemented for a differential measurement. As such an advantage is drawn from the presence of two capacitive stacks that each have, at rest, the same mechanical stress and the same permittivity values. However, in a situation of actuating, each one of its capacitive stacks will be subjected to a different mechanical stress and a different variation in the permittivity values. By taking a differential measurement of these permittivities, it is possible to evaluate the deformation of the structure in a way that is less sensitive to external disturbances. In this framework, such as in the example of FIGS. 5 and 6, the secondary capacitive stack formed from the secondary measuring electrode forms a reference that can be placed in particular on a fixed portion of the structure.

Figure 7:
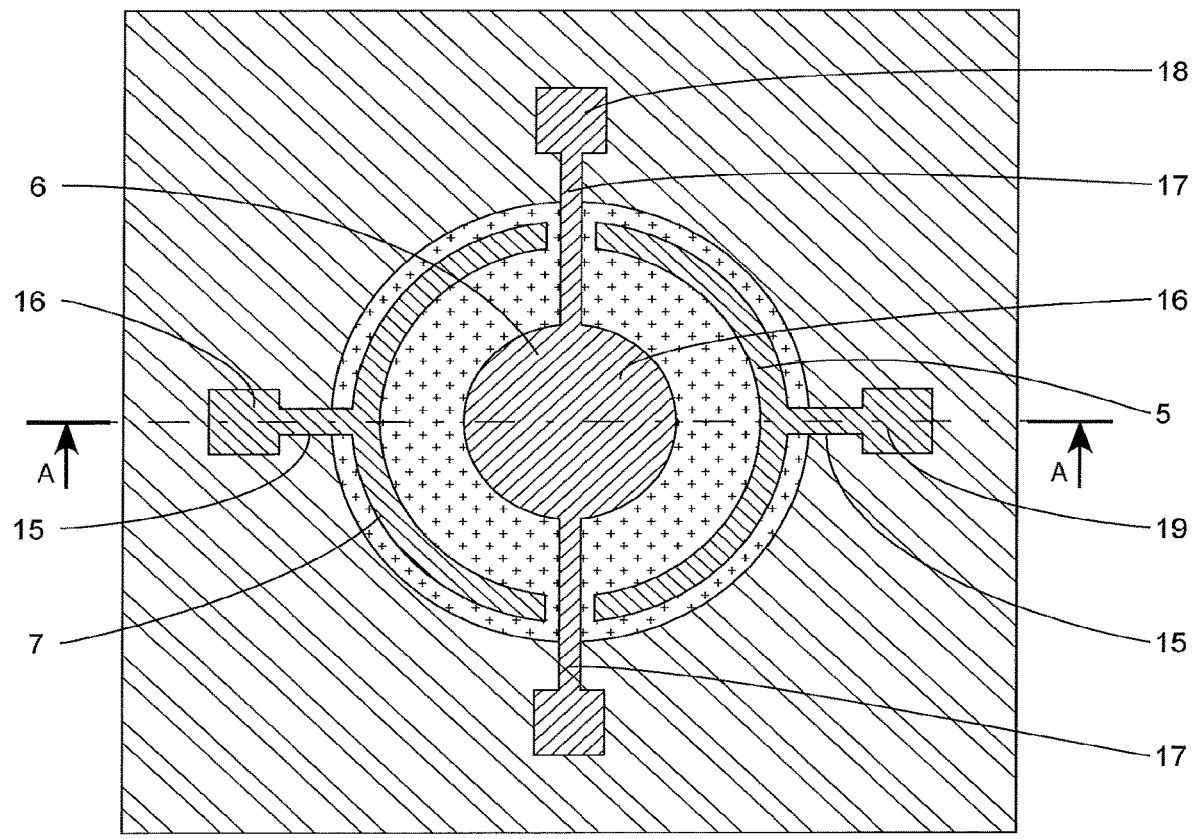
FIG. 7 is a top view according to a fourth embodiment of the invention.
Figure 8:
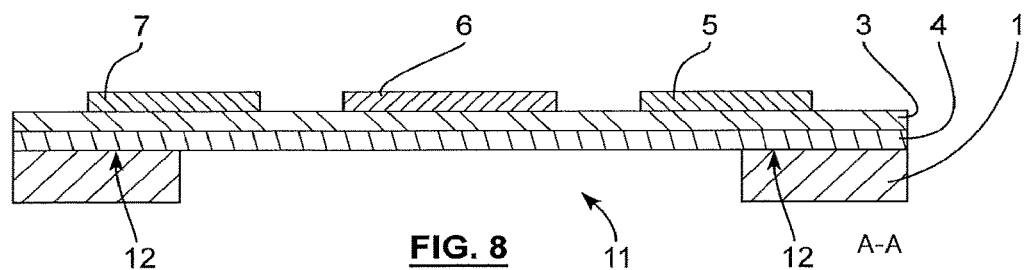
FIG. 8 shows the actuator of FIG. 7 as a cross-section according to the lines AA of FIG. 7.

FIG. 7 shows, in combination with FIG. 8, another embodiment of the invention wherein the flexible portion is formed from a membrane. As hereinabove, the latter extends above a cavity 11 formed in the support 1. Preferably, the entire contour of the membrane is anchored relatively to the support, on the contour of the cavity 11. Preferably, the contour of the membrane forming the flexible portion is circular, in particular when the profile of the mobile portion is circular, the measuring electrode advantageously has an arched profile.

In a first case corresponding to the embodiments of FIGS. 7 and 8, a first capacitive stack was formed on the measuring electrode 5. Moreover, a second capacitive stack was formed on the secondary measuring electrode 7. In the example shown, a central symmetry of the actuator is produced, on the center of the membrane which is circular. Preferably, at least one portion of one of the electrodes 5, 7 has an arched profile that extends over the membrane concentrically with the latter. In the case of FIG. 7, the two electrodes 5, 7 are formed on either side of a diameter of the membrane symmetrically and have the same shapes and diameter. They are located at the same level of radius of the circular contour of the membrane. It is understood that these portions form arched portions advantageously in the arc of circle on the flexible portion. A branch 15 can be connected to the arched portion in such a way as to connect the latter to a corresponding portion of the electrode located on the anchoring zone 12. In particular, the branch 15 makes it possible to connect the arched portion to a stud 19 allowing for contact to resume. As hereinabove, it is advantageous, at least for the electrode 5, to place a majority of its surface area on a zone on the flexible portion of the deformable element 2 that has a strong concentration of stresses. As hereinabove, it is even desirable to carry out this locating in a zone that has a peak (i.e. a maximum on a stress concentration curve). The embodiment of FIGS. 7 and 8 has a placing that corresponds to the secondary electrode 7 in such a way that the two capacitive tacks are located in zones where stress concentration maxima occur.

If needed it is possible to place the electrodes 5 and 7 in zones of the flexible portion that undergo stresses of opposite signs (one in traction of the center line, the other in compression).

In this embodiment, the actuating electrode 6 extends preferably along a diameter of the membrane. According to this direction, from a first side of the membrane, the electrode 6 comprises a branch 17 then a central portion 16 then another branch 17 that makes it possible to reach an opposite of the membrane. Possibly, at the ends of the branches 17, studs 18 can be formed. Advantageously, the central portion 16 is a central disk on the circular profile of the membrane. The diameter of this disk can be between a quarter and half of the one of the membrane.

Figure 9:
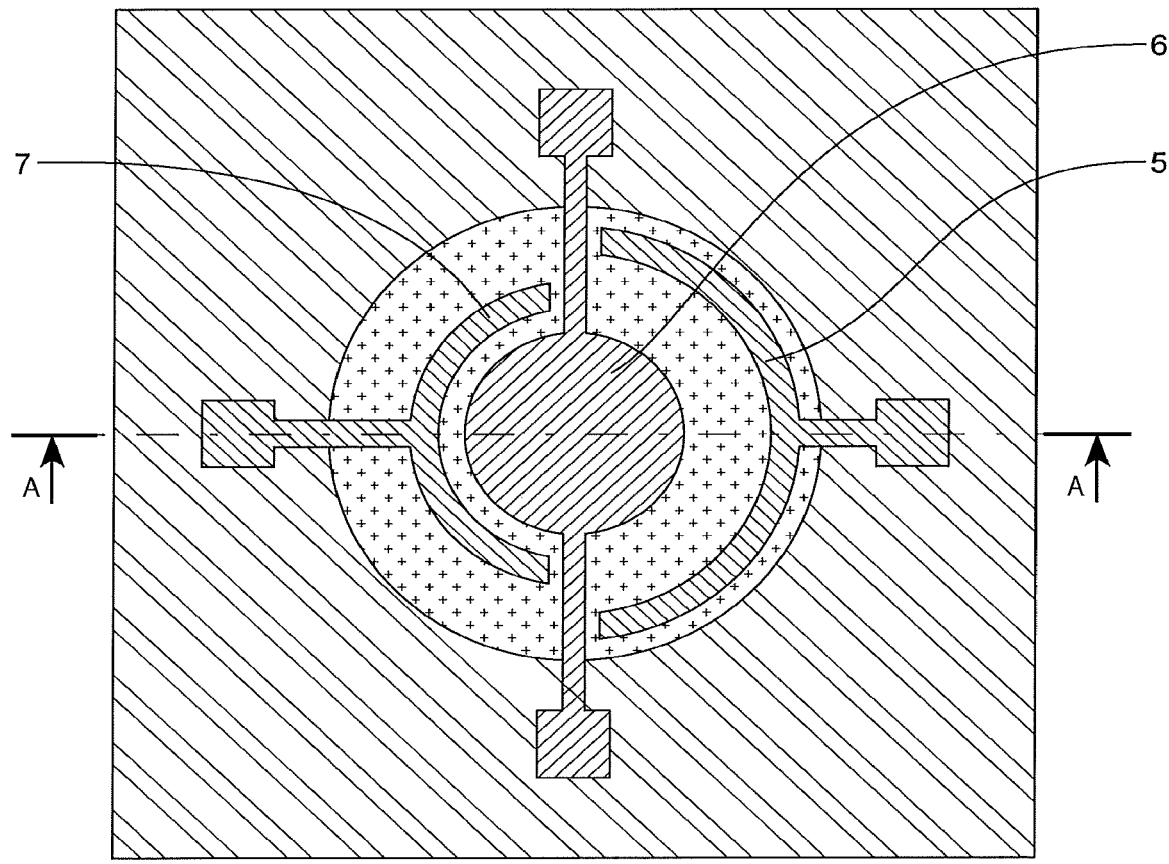
FIG. 9 shows from above a fifth embodiment of the invention.

FIG. 9 shows an alternative embodiment of FIGS. 7 and 8 in that the secondary electrode 7 is always positioned in such a way as to have an arched portion concentric with the circular contour of the membrane of the flexible portion but in a manner that is closer to the center of this circular contour. More precisely, it is advantageous that the arched portion be a portion of an arc of circle of which the radius corresponds to half of the radius of the circular contour of the membrane. In this way, the arched portion of the electrode 7 is located in a zone that has a minimum of stress concentration. Indeed, on such a membrane, the highest stresses are located in the vicinity of the anchoring zone 12 and on the center of the membrane. In an intermediate zone, a point of inflection is observed and a minimum concentration of stresses is produced at this level. As such, in this case, a differential measurement can be taken according to the same principle as the one shown in reference to FIGS. 5 and 6 with the deformable elements 2. In particular, the secondary capacitive stack formed from the secondary electrode 7 produces small variations in stresses and permittivity between a rest position and position of actuating of the deformable element 2.

Figure 10:
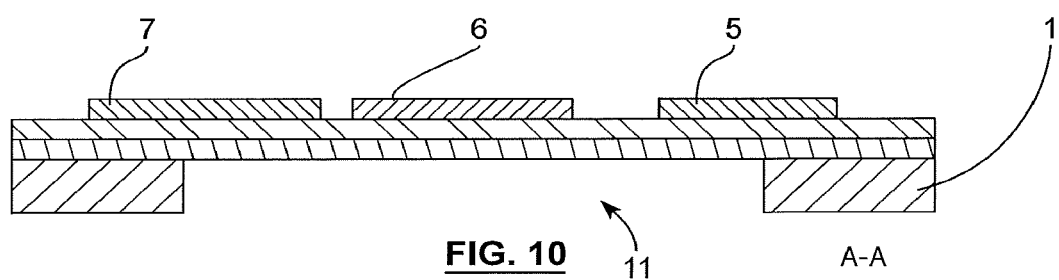
FIG. 10 shows the actuator of FIG. 9 as a cross-section according to the lines AA of FIG. 9.

FIG. 10 has a cross-section of the embodiment of FIG. 9 that shows the differentiation in positioning of the arched portions respectively of electrodes 5 and 7.

FIGS. 11a to 14b show a succession of steps potential steps for the manufacture of an actuator according to the invention in an embodiment that corresponds to that of FIGS. 7 and 8.

Figure 11A:
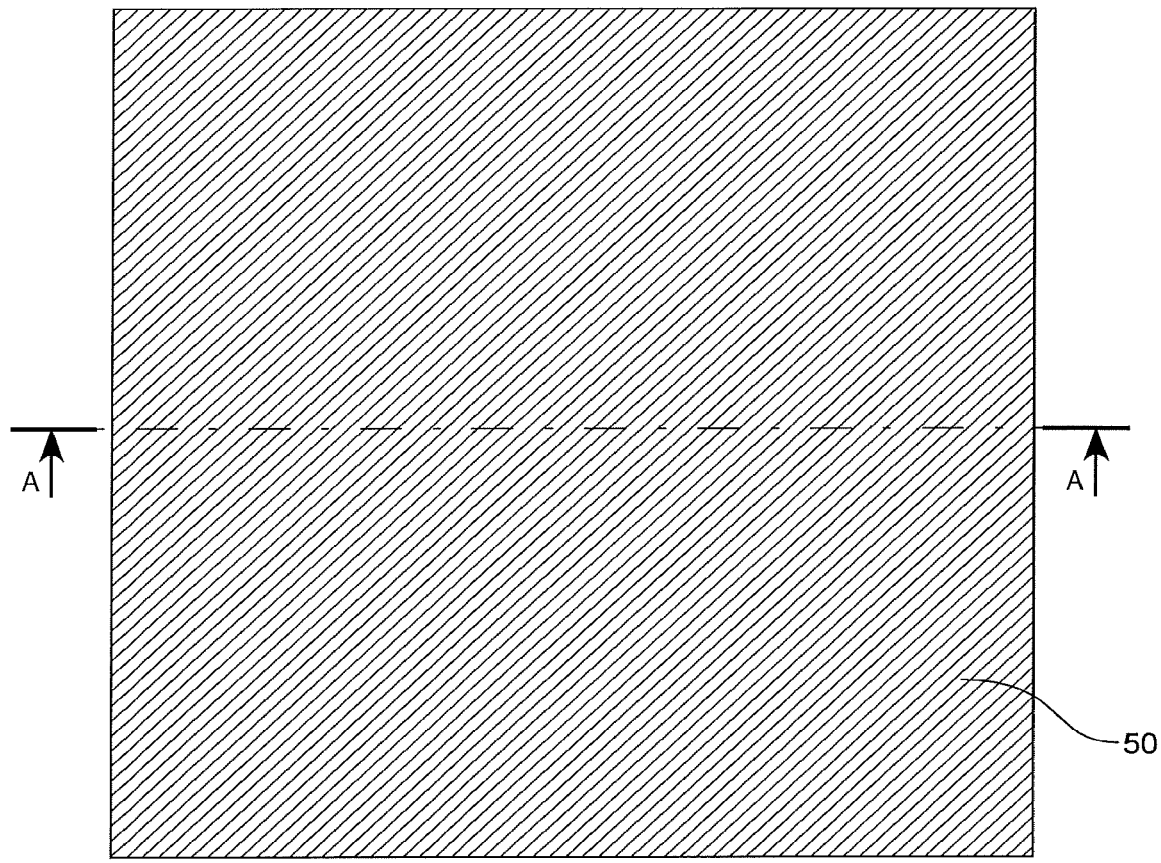
Figure 11B:
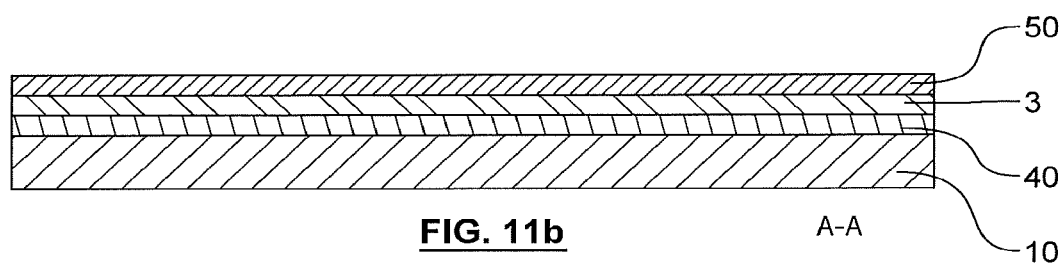

FIGS. 11a and 11b show a stack of layers made on a support layer 10 (substrate) from which the support 1 is formed. This stack comprises a layer 40 for the formation of the reference electrode, a layer 3 forming the electro-active layer, and a layer 50 that makes it possible to form measuring electrode or electrodes and the actuating electrode or electrodes. The formation of this stack can be carried out by depositions that implement conventional techniques of microelectronics in particular by spraying or evaporation.

FIGS. 12a and 12b show a following step in which the actuating 6 and measuring 5, 7 electrodes are formed from the layer 50. To this effect, a lithographic method can be implemented to protect the zones that are to be retained and an etching, chemical or physical, can make it possible to remove the undesired zones, not covered by the lithographic method. Conventionally, the resin used for the lithography can then be removed, for example chemically with a solvent.

Figure 13A:
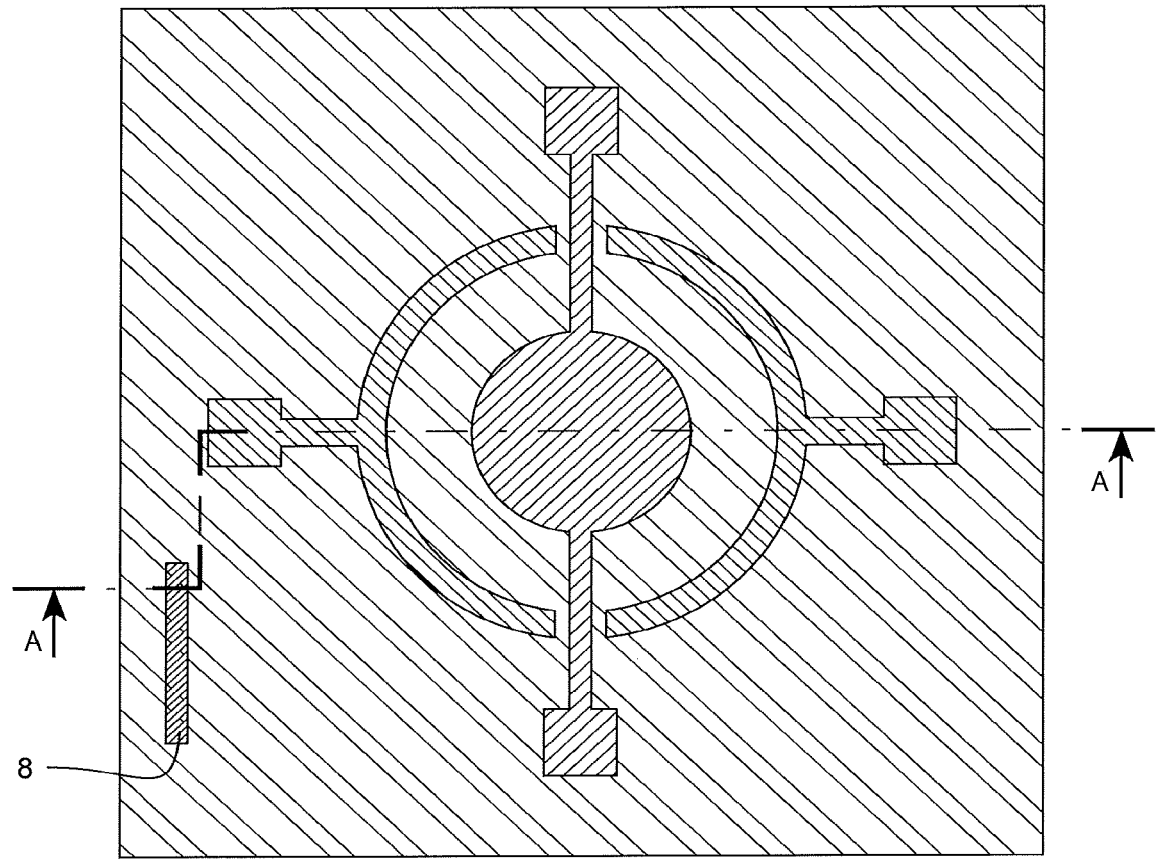
Figure 13B:
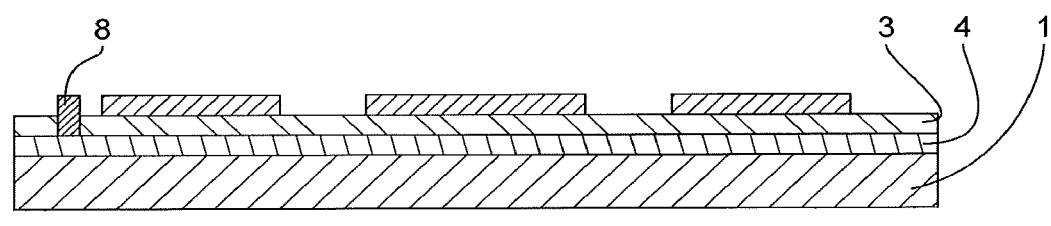

FIGS. 13a and 13b show another step in the method of manufacturing wherein a contact for resuming is made for the reference electrode 4. To this effect, a connecting member 8 is produced. To do this, an opening can be made in a portion of the electro-active layer 3 not covered by an electrode 5, 6 or 7; this opening can be made as hereinabove with a lithographic method followed by an etching. Furthermore, before removing the lithography resin, a conductor material can be deposited, typically a metal, in this opening in such a way as to produce the connecting member 8. In particular, via a "lift off" method, only the metal deposited on the opening of the layer will be retained after the removal of the resin. This deposition can facilitate the renewal of contact on the later reference electrode. Note that the electro-active layer 3 is typically sufficiently electrically insulating so as not to require insulation of the opening before the depositing of the connecting member 8.

Figure 14A:
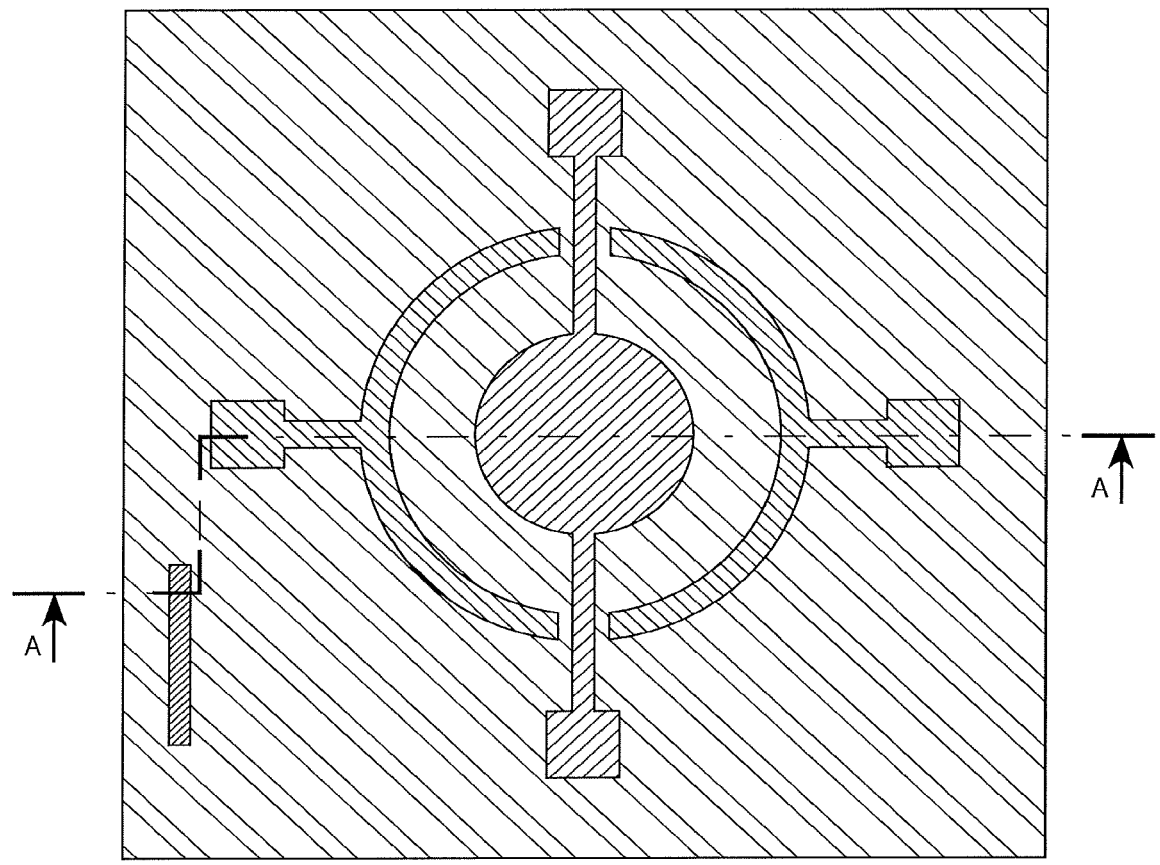
Figure 14B:
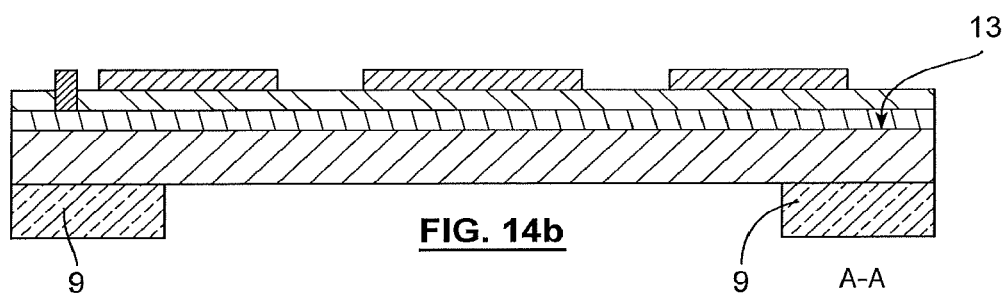

FIGS. 14a and 14b show another step in which a mask 9 is formed on one face of the support 1 opposite the face 13 through which is carried out the stack of layers that participating in the deformable element 2. This mask 9 is advantageously a hard mask used for the later photoengraving of the rear face of the support 1 so as to create a cavity 11. Preferably, the mask layer 9 is a material chosen to be able to be selectively etched with respect to the support. For example, if the support 1 is made of silicon, the hard mask 9 can be made of silicon dioxide, which can be etched selectively via a sulfur hexafluoride plasma. The mask 9, for example made of silicon dioxide, can in particular be deposited by a technique of plasma enhanced physical-chemical vapor deposition. The hard mask is structured by a lithography step then by an etching (in particular a chemical etching with hydrofluoric acid). The resin of the lithography is then removed using a solvent such as acetone.

Figure 15A:
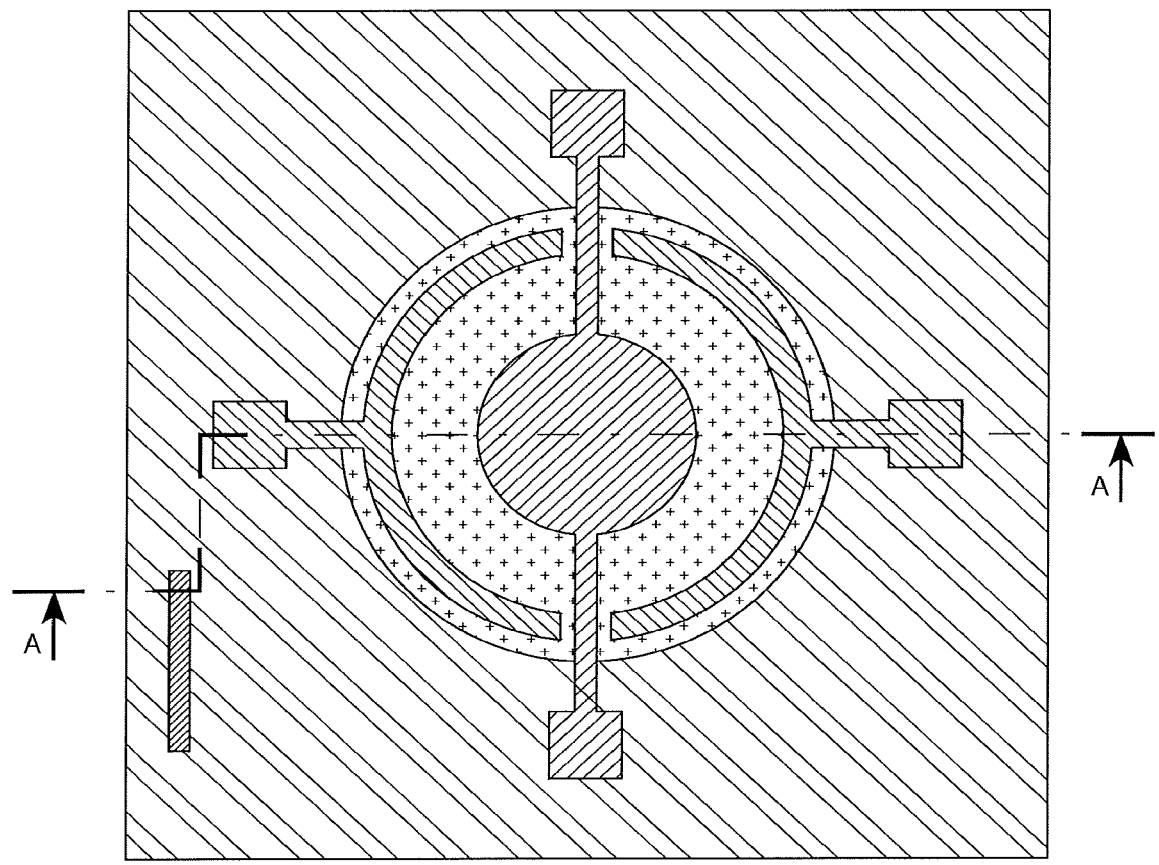
Figure 15B:
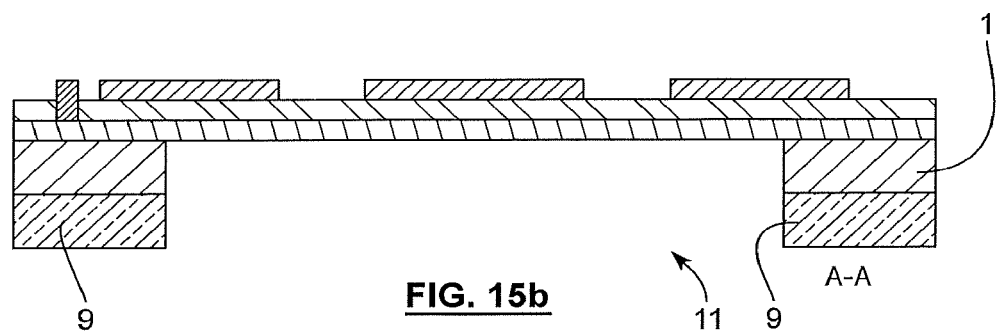

Once the mask 9 is prepared, it is possible to create the cavity 11. To this effect, FIGS. 15a and 15b show an etching of the substrate from its rear face opposite the face 13 outside of the mask 9. It is possible for example to use a reactive ionic etching, preferably based on the Bosch® method.

FIGS. 16a and 16b finally show the connection of the electrodes with a control and signal processing portion of the actuator. This connection can be made by gold wire welds. As shown, it is possible to use a voltage source S which will make it possible to electrically supply the actuating electrode 6 s a counterpoint of the reference electrode 4. The latter is furthermore connected to a reference potential, for example the ground, preferably via the connecting member 8. With regards to the measurement, a capacity meter C is connected a measuring electrode 5, here on a stud 19 of the latter. Another input of the capacity meter is also placed at the reference potential such as the ground and connected to the reference electrode.

Note that the chronology of the steps indicated hereinabove for the production of this actuators is only an indication; in particular, the steps of formation of the connecting member 8 can be carried out at other times.

Unless specified otherwise, the technical characteristics described in detail for a given embodiment can be combined with the technical characteristics described in the context of other embodiments described as examples and not exhaustive, including those explained in detail hereinabove. For example, the form of the measuring electrode 5 of FIG. 3 can be transposed to the embodiments of FIGS. 1, 2, 5 and 6. The same applies for the form of the actuating electrode 6. Likewise, the differential measurement can be applied to all cases.

The invention claimed is:

1. An electromechanical actuator that comprises a support and a deformable element that comprises a portion anchored to at least one anchoring zone of the support and a mobile portion, with the deformable element comprising an electro-active layer, a reference electrode arranged on a first face of the electro-active layer and an actuating layer arranged on a second face, opposite the first face of the electro-active layer, with the electro-active layer being configured to be deformed under the effect of a difference in potential applied between the reference electrode and the actuating electrode, said actuator comprising:

a capacitive device for measuring the deformation of the deformable element, said device being at least partially formed by a capacitive stack comprising a measuring electrode arranged on the second face of the electro-active layer, a measuring portion of the reference electrode located facing the measuring electrode, and a portion of the electro-active layer inserted between the measuring electrode and the measuring portion of the reference electrode, the capacitive measuring device being configured to measure the capacity of the capacitive stack.

2. The actuator according to claim 1, wherein the capacitive stack is located in the vicinity of the anchoring zone.

3. The actuator according to claim 1, wherein the capacitive stack is located for a portion in the anchored portion and for a portion in the mobile portion.

4. The actuator according to claim 1, wherein at least one portion of the capacitive stack is located in a zone of the deformable element that has a peak of concentration of bending stress.

5. The actuator according to claim 1, wherein the mobile portion comprises a beam or a membrane with a circular, rectangular or polygonal profile.

6. The actuator according to claim 5, wherein at least one portion of the measuring electrode has a profile parallel to the profile of the mobile portion.

7. The actuator according to claim 6, wherein at least one portion of the measuring electrode has an arched profile and at least one portion of the mobile portion has a circular profile; said profiles being preferably parallel.

8. The actuator according to claim 1, wherein the measuring device comprises a secondary capacitive stack that comprises a secondary measuring electrode arranged on the second face of the electro-active layer, a secondary measuring portion of the reference electrode located facing the secondary measuring electrode, and a portion of the electro-active layer inserted between the secondary measuring electrode and said secondary measuring portion of the reference electrode.

9. The actuator according to claim 8, wherein
the mobile portion comprises a beam or a membrane with a circular, rectangular or polygonal profile, and
at least one portion of the secondary measuring electrode has a profile parallel to the profile of the mobile portion.

10. The actuator according to claim 9, wherein the mobile portion comprises a membrane having a circular profile, the profile of the portion of the secondary measuring electrode being arched and located at mid-radius of the circular profile.

11. The actuator according to claim 8, wherein at least one portion of the secondary capacitive stack is located in a zone of the deformable element that has a minimum of concentration of stress.

12. The actuator according to claim 8, wherein at least one portion of the secondary capacitive stack is located in a zone of the deformable element having a stress with a sign opposite that of a zone in which is located at least one portion of the capacitive stack.

13. The actuator according to claim 8, comprising a device for a differential treatment of variations in capacity values of the capacitive stack and of the secondary capacitive stack.

14. The actuator according to claim 1, comprising a voltage source (S) connected, by a first of its terminals, to the actuating electrode, a capacity meter (C) connected, by a first of its terminals, to the measuring electrode, second terminals of the voltage source and of the capacity meter being both connected to the reference electrode and to a reference potential.

15. The actuator according to claim 1, wherein the electro-active layer comprises at least one layer of a material chosen from: a piezoelectric material, an electro-strictive material, a para-electric material or a relaxor material.

16. The actuator according to claim 1, wherein the measuring electrode and the actuating electrode are etched portions of a same layer of material.

17. The actuator according to claim 1, formed by a microelectronic component.

* * * * *